(12) United States Patent  
Riley

(10) Patent No.: US 7,417,470 B2  
(45) Date of Patent: Aug. 26, 2008

(54) PHASE FREQUENCY DETECTOR WITH A NOVEL D FLIP FLOP

(75) Inventor: Tom Riley, Osgoode (CA)

(73) Assignee: Kaben Wireless Silicon Inc., Ottawa (CA)

( * ) Notice: Subject to any disclaimer, the term of this patent is extended or adjusted under 35 U.S.C. 154(b) by 50 days.

(21) Appl. No.: 11/529,252

(22) Filed: Sep. 29, 2006

(65) Prior Publication Data

US 2007/0018705 A1      Jan. 25, 2007

Related U.S. Application Data

(63) Continuation-in-part of application No. PCT/CA2004/000511, filed on Apr. 2, 2004.

(51) Int. Cl.
*H03D 13/00* (2006.01)
*H03K 3/356* (2006.01)

(52) U.S. Cl. .............. 327/7; 327/218; 327/12

(58) Field of Classification Search ........ 327/3, 327/7, 12, 218
See application file for complete search history.

(56) References Cited

U.S. PATENT DOCUMENTS 6,323,692 B1 * 11/2001 Tsinker .............. 327/12
6,323,709 B1    11/2001 Kulkarni et al.
6,617,884 B2 *  9/2003 Wang et al. ......... 327/12
6,683,478 B2 *  1/2004 Yoo .................. 327/12
6,856,202 B2 *  2/2005 Lesso ............... 331/1 A
7,003,065 B2 *  2/2006 Homol et al. ....... 375/376

FOREIGN PATENT DOCUMENTS

JP         9 089988         4/1997
JP         9 214300         8/1997

OTHER PUBLICATIONS

Jiren Yuan et al: "High Speed CMOS Circuit Technique" 8107 IEEE Journal of Solid-State Circuits, vol. 24, No. 1, Feb. 1, 1989, pp. 62-70, XP000023253, ISSN 0018-9200.

* cited by examiner

*Primary Examiner*—Kenneth B. Wells
*Assistant Examiner*—Ryan C Jager
(74) *Attorney, Agent, or Firm*—Brian Patent Agency; Art Brian

(57) ABSTRACT

Methods, systems and components for use with or as a phase frequency detector. The phase frequency detector stretches its output pulse, allowing the detector to operate in a more linear region. As part of the invention, a new configuration for a D type flip flop is also disclosed. In one embodiment, the D type flip flop triggers at both the rising and the falling edges of the reference input, allowing a lower frequency input to be used while having the advantages of a higher frequency.

14 Claims, 4 Drawing Sheets

PHASE FREQUENCY DETECTOR WITH A NOVEL D FLIP FLOP

CROSS REFERENCE TO RELATED APPLICATIONS

This application is a continuation-in-part of international application Number PCT/CA2004/000511 filed 2 Apr. 2004.

FIELD OF THE INVENTION

The present invention relates to electronics and, more specifically, relates to a phase frequency detector circuit employing a novel D flip flop element.

BACKGROUND TO THE INVENTION

The recent revolution in telecommunications has led to a corresponding revolution in electronics. Wireless communications devices are now as plentiful as the rotary telephone of yesteryears. One key component of many wireless circuits is the delta sigma controlled fractional N frequency synthesizer. Such a circuit allows for the synthesizing of almost any required signal frequency. As part of this component, a phase frequency detector (PFD) receives an input reference signal with a known frequency and a variable input signal, known as a divider input, with a variable frequency determined by dividing a VCO (voltage controlled oscillator) frequency. The PFD outputs a signal that is proportional to the difference in phase between the input reference signal and the divider input. This output can then be used to increase-or decrease the VCO frequency to minimize the phase difference. This feedback arrangement is called a phase lock loop or a PLL.

Current PFD designs suffer from what is commonly termed a "deadzone". When the frequency synthesizer is in lock, the phase difference between the reference and the divider input is very close to zero. Thus, the output (or outputs as the PFD may have more than one output) should not be active or, if they are, the pulses produced should be very narrow. For small phase errors close to zero, due to delays and uncontrollable circumstances, it is not possible to create a complete pulse at the output of the PFD. This results in a flat or non-linear section in the PFD transfer curve normally termed a deadzone. While not very serious for integer-N synthesizers, this can result in increased fractional-N spur levels for delta sigma controlled fractional-N frequency synthesizers.

As such, there is therefore a need for systems and components which avoid the above problems. It is therefore an object of the present invention to mitigate if not overcome the shortcomings of the prior art.

SUMMARY OF THE INVENTION

The present invention provides methods, systems and components for use with or as a phase frequency detector. The phase frequency detector stretches one of its output pulses, forcing the PLL to operate in a region where the phase difference between the divider and the reference is no close to zero. This allows the detector to operate in a more linear region. As part of the invention, a new configuration for a D type flip flop is also disclosed. In one embodiment, the D type flip flop triggers at both the rising and the falling edges of the reference input, allowing a lower frequency input to be used while having the advantages of a higher frequency.

In a first aspect, the present invention provides a D-type flip flop comprising:
a first FET (field effect transistor) receiving an input signal at its gate terminal;
a delay element also receiving said input signal, said delay element outputting a delayed logical inverse of said input signal;
a second FET receiving an output of said delay element at its gate terminal, a drain terminal of said second FET being coupled to a source terminal of said first FET, a source terminal of said second FET being coupled to a relative ground;
a reset FET coupled to said relative ground by way of its source terminal, a drain terminal of said reset FET being coupled to a junction node, a gate terminal of said reset FET being coupled to an external reset input;
a third FET coupled by way of its source terminal to said junction node, a drain terminal of said third FET being coupled to a power supply, a gate terminal of said third FET being coupled a drain terminal of said first FET;
a fourth FET coupled to said drain terminal of said first FET by way of a source terminal of said fourth FET, a drain terminal of said fourth FET being coupled to said power supply and a gate terminal of said fourth FET being coupled to said junction node, wherein
an output of said flip flop is tapped from said junctions node;
said first, second and reset FETs are of the same type of FET; and
said third and fourth FETs are of the same type of FET.

In a second embodiment the present invention provides a phase-frequency detector circuit comprising:
a first D flip flop receiving a reference input;
a second D flip flop receiving a divider input;
a first NAND gate receiving a first select input and said divider input;
a first NOT gate receiving an output of said first NAND gate;
a NOR gate receiving an output of said first NOT gate and an output of said first D flip flop;
a second NOT gate receiving an output of said NOR gate and producing a first output of said detector circuit;
a second NAND gate receiving-said-output of said first D flip flop gate and an output of said second D flip flop;
a third NOT gate receiving an output of said fourth NAND gate, an output of said third NOT gate being received as a reset input to both said first and second D flip flops.

In a third embodiment, the present invention provides a phase frequency detector circuit comprising:
a first D flip flop receiving a reference input;
a second D flip flop receiving a divider input;
a first NAND gate receiving a select input and said divider input;
a second NAND gate receiving an output of said first NAND gate and a logical inverse of an output of said second D flip flop;
a first NOT gate receiving an output of said second NAND gate and producing an output of said detector circuit;
a third NAND gate receiving an output of said first D flip flop and said output of said second D flip flop;
a second NOT gate receiving an output of said third NAND gate, an output of said second NOT gate being received as a reset input to both said first and second D flip flops.

In yet another embodiment the present invention provides a phase frequency detector circuit comprising:
a first D flip flop receiving a reference input;
a second D flip flop receiving a divider input;

a first NAND gate receiving a first select input and said divider input;
a first NOT gate receiving an output of said first NAND gate;
a NOR gate receiving an output of said first NOT gate and an output of said first D flip flop;
a second NOR gate receiving an output of said NOR gate and producing first output of said detector circuit;
a second NAND gate receiving a second select input and said divider input;
a third NAND gate-receiving an output of said first D flip flop and an output of said second D flip flop;
a third NOT gate receiving an output of said third NAND gate, an output of said third NOT gate being received as a reset input to both said first and second D flip flops;
a fourth NAND gate receiving a second select input and said divider input;
a fifth NAND gate receiving an output of said first NAND gate and a logical inverse of said output of said second D flip flop;
a fourth NOT gate receiving an output of said fifth NAND gate and producing a second output of said detector circuit.

In a fifth embodiment the present invention provides, a phase frequency detector comprising:
at least two D flip flops;
a plurality of logic gates, at least one of said logic gates being coupled to at least one of said D flip flops, wherein at least one of said at least two D flip flops comprises:
a first FET (field effect transistor) receiving an input signal at its gate terminal;
a delay element also receiving said input signal, said delay element outputting a delayed logical inverse of said input signal;
a second FET receiving an output of said delay element at its gate terminal, a drain terminal of said second FET being coupled to a source terminal of said first FET, a source terminal of said second FET being coupled to a relative ground;
a reset FET coupled to said relative ground by way of its source terminal, a drain terminal of said reset FET being coupled to a junction node, a gate terminal of said reset FET being coupled to an external reset input;
a third FET coupled by way of its source terminal to said junction node, a drain terminal of said third FET being coupled to a power supply, a gate terminal of said third FET being coupled a drain terminal of said first FET;
a fourth FET coupled to said drain terminal of said first FET by way of a source terminal of said fourth FET, a drain terminal of said fourth FET being coupled to said power supply and a gate terminal of said fourth FET being coupled to said junction node, wherein
an output of said flip flop is tapped from said junctions node;
said first, second and reset FETs are of the same type of FET; and
said third and fourth FETs are of the same type of FET.

BRIEF DESCRIPTION OF THE DRAWINGS

A better understanding of the invention will be obtained by considering the detailed description below, with reference to the following drawings in which.

DETAILED DESCRIPTION

Figure 1:
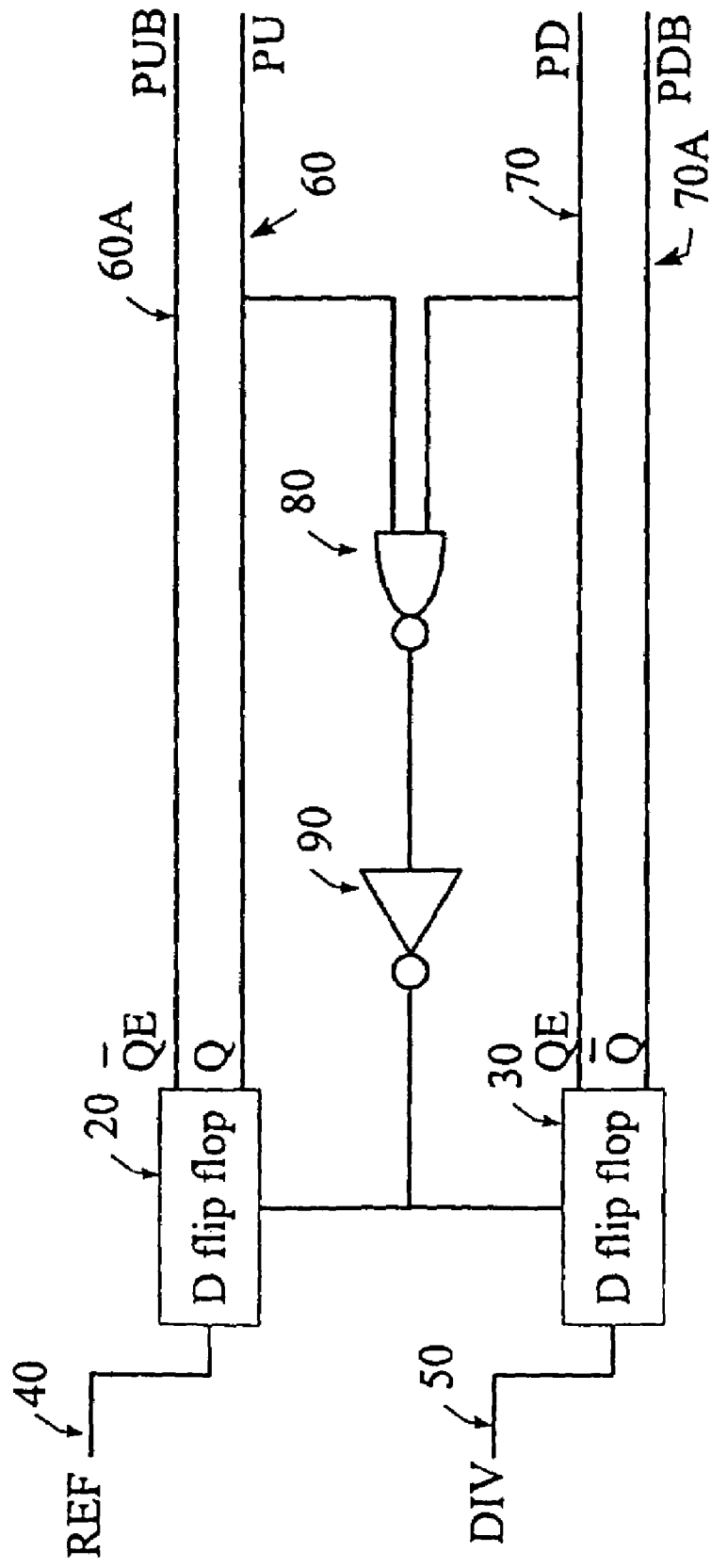
FIG. 1 illustrates a phase frequency detector according to the prior art.

Referring to FIG. 1, a phase frequency detector 10 according to the prior art is illustrated. Two D type flip flops 20, 30 are illustrated with flip flop 20 receiving a reference input 40 and flip flop 30 receiving a variable frequency input 50 known as a divider input. As is well known in the art, the PFD 10 seeks to minimize the phase difference between the reference input 40 and the divider input 50. The outputs 60, 70 can be used as a feedback to the VCO. Output 60, known as the pump up output (output Q of D flip flop 20), is high when the reference edge arrives before the divider edge arrives. Thus, in this case, the VCO signal must be "pumped up" or increased to match the divider input. Similarly, if the divider edge arrives first, the other-output, known as the pump down output (output Qe of D flip flop 30), is high. This means that the reference frequency must be reduced to match the divider input. To provide flexibility in the logic used, each output has a corresponding logical inverse as part of the output. Output 60A (PUB or pump up bar or output Qe) is the logical inverse of the output 60 while output 70A (PDB or pump down bar or output Q) is the logical inverse of the output 70.

The system is reset after every pulse so the D flip flops 20, 30 may resample the incoming reference and divider inputs. The reset is accomplished using the NAND gate 80 and NOT gate 90. The NAND gate 80 receives outputs 60, 70 and its output is received by NOT gate 90. The output of NOT gate 90 is received at the reset ports of the D flip flops 20, 30. Because of delay through the gates 80, 90 the reset does not immediately occur, resulting in a finite pulse width for the outputs even when the PFD is in lock (i.e. when the reference frequency and divider input have minimal phase difference). The widths of the output pulses are proportional to the phase difference between the rising edges of the inputs. In an alternative, the NAND gate 80 and NOT gate 90 can be replaced by a single AND gate. It should be noted for clarity that when referring to an output of a d flip flop, this is to mean either Q or Qe and not the logical inverse of these outputs.

Figure 2:
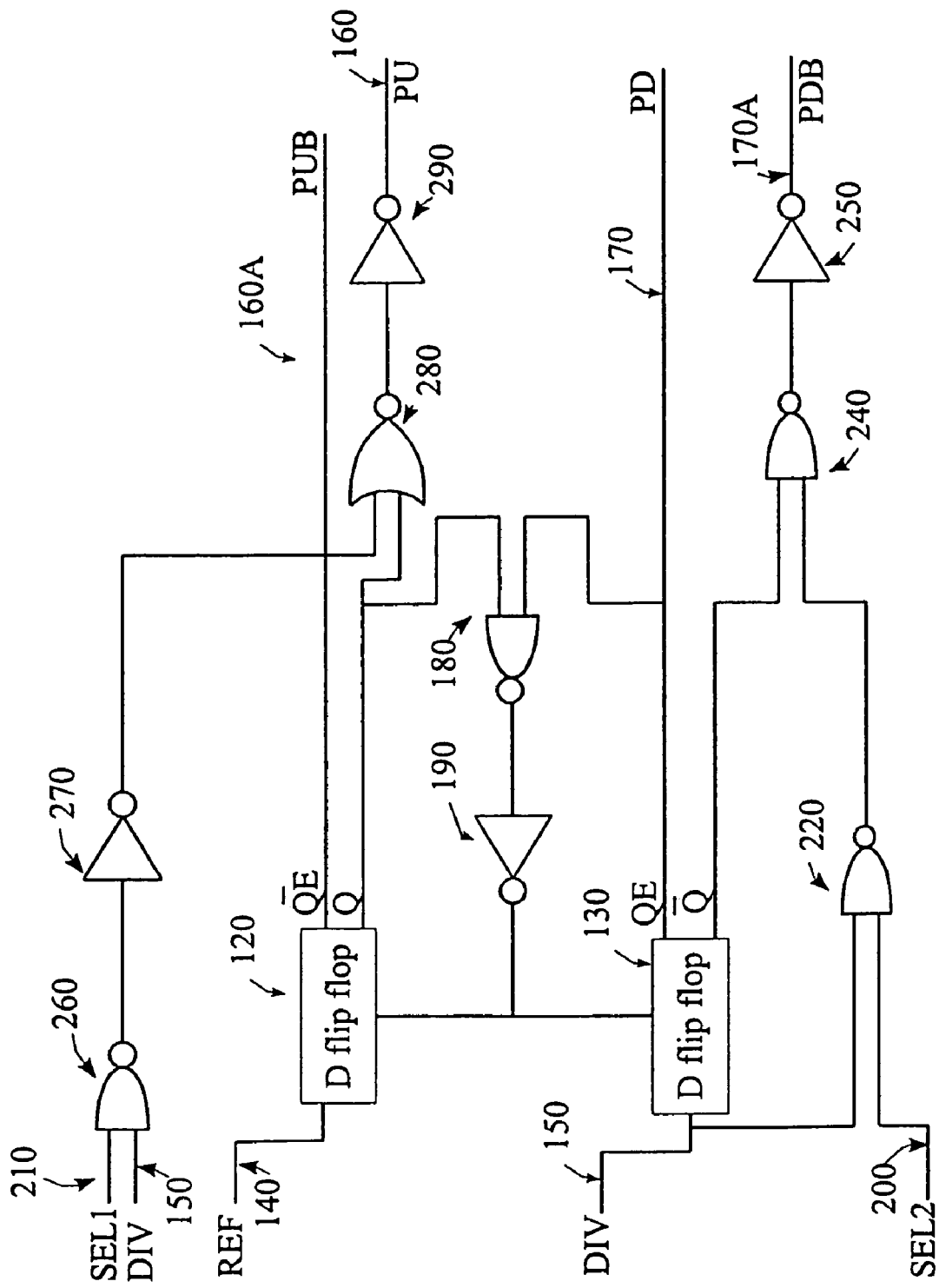
FIG. 2 illustrates a phase frequency detector according to one aspect of the invention.

Referring to FIG. 2, a novel arrangement for a phase frequency detector 100 is illustrated. Two D flip flops 120,130 receive a reference input 140 and a divider input 150. The divider input 150 is a variable frequency input signal which is adjusted up or down based on the status of the output signals while reference input 160 is a fixed frequency input signal. Much like the system in FIG. 1, the pump up output 160 has a counterpart logical inverse output pump up bar output 160A. The pump down output 170 similarly has a logical inverse counterpart—a pump down bar (PDB) output 170A.

The reset arrangement for the system in FIG. 2 is similar to that in FIG. 1 —a NAND gate 180 receives outputs 160,170 and passes its output to a NOT gate 190. The output of the NOT gate 190 is received by the reset inputs of D flip flops 120,130.

To select which outputs are to be stretched or which outputs are to have their pulses extended, select inputs 200, 210 are provided. If select input 200 is high, then the pump down output 170A is extended while if select input 210 is high, then the pump up outputs 160,is extended.

The above feature is implemented by properly gating selected outputs of the D flip flops with the select inputs 200, 210. Select input 200 is received, along with the divider input 150, by a NAND gate 220. The output of NAND gate 220 is received, along with the logical inverse 230 of the pump down output 170, by a NAND gate 240. The output of NAND gate 240 is then received by NOT gate 250. The output of NOT gate 250 is the extended pump down bar output 170A. The NAND gate 220 may, if desired, be a single NOT gate receiving the select input 200.

For the extended pump up output 160, the select input 210 is received by NAND gate 260 along with the divider input 150. The output of NAND gate 260 is received by NOT gate 270, the output of which is received by NOR gate 280. NOT gate 280 also receives the pump up output of D flip flop 120. The result of NOR gate 280 is NOT gated (NOT gate 290) to produce the pump up output 160 of the phase frequency detector 100.

It should be noted that while the embodiment in FIG. 2 extends the pulse of the pump up output 160 and of the pump down bar output 170A, a similar arrangement, but with different gating connections, can provide extension of the pulses of the other outputs. The logic behind the embodiment illustrated in FIG. 2 is that the divider output is OR'd with either the pump up output or the pump down bar output of the detector. The two select inputs are used to control which of the outputs get stretched or extended. If the pump up output is stretched or extended, feedback will similarly extend or stretch the other output (pump down bar output) to compensate. In a similar manner, if the pump down bar output is extended, the pump up output will be extended as well to compensate. This arrangement introduces a DC phase offset and the loop does not lock at zero degrees phase offset but rather at an offset controlled by the divider pulse width. The phase frequency detector can thus now operate in a more linear region.

It should further be noted that while FIG. 2 illustrates two select inputs 200, 210, the invention may be implemented as having only one select input and as extending only one of the output pulses. If the implementation only required extending the output pulse 160, then gates 220, 240, 250 need not be implemented. Similarly, if only the output pulse 170A needs to be extended, then gates 260, 270, 280, 290 need not be implemented. In these two alternative embodiments, the sole select input (either of select inputs 200, 210 as the case may be) will still extend the relevant output pulse.

Figure 3:
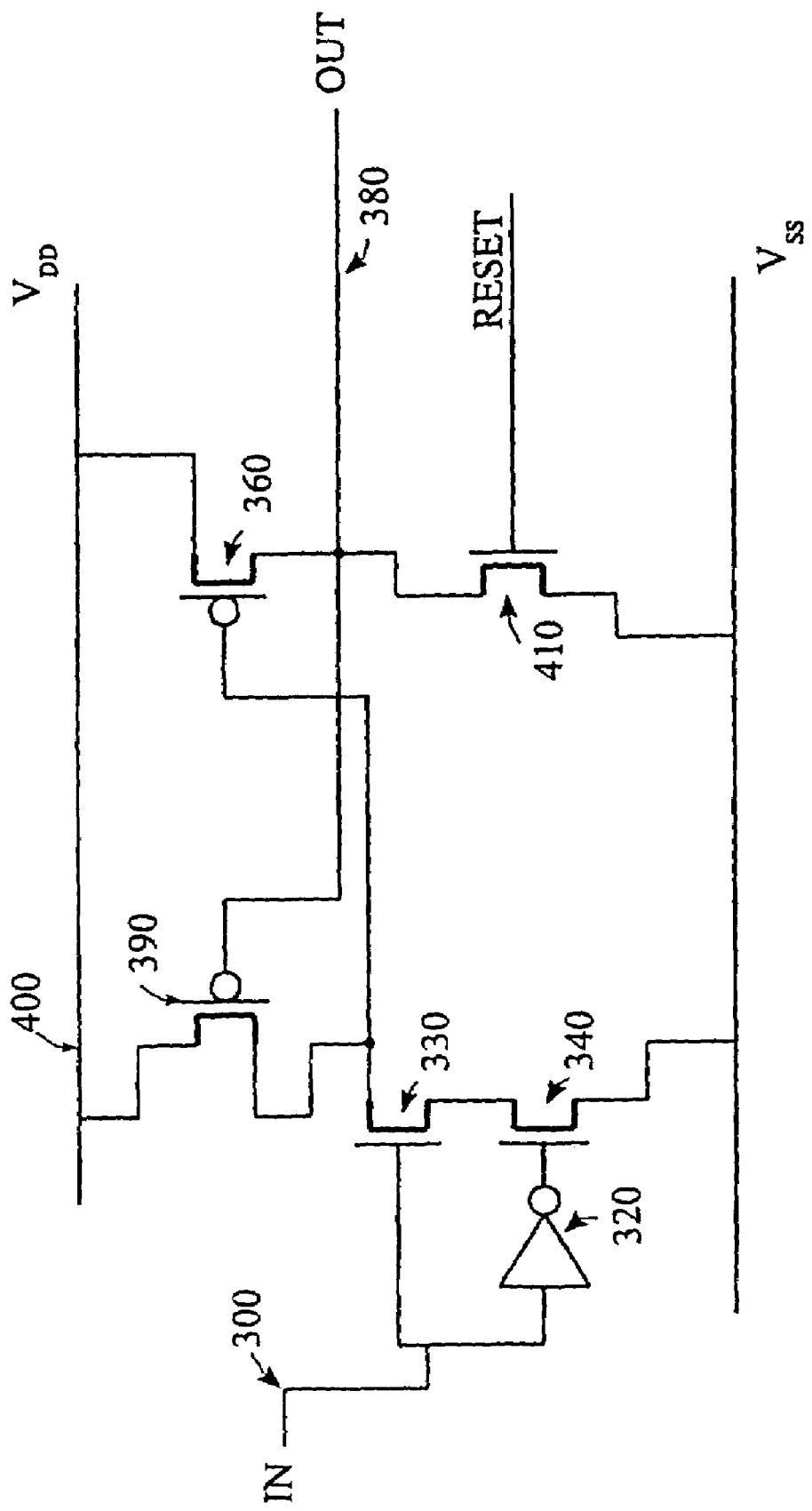
FIG. 3 illustrates a D flip-flop which may be used in the phase frequency detector of FIG. 2.

Referring to FIG. 3, a structure for a novel D flip flop which may be used in the phase frequency detector of FIG. 2 is illustrated. An input 300 to the D flip flop 310 is received by a NOT gate 320 (a delay element) and a gate of FET (field effect transistor) 330. The NOT gate output is received by the gate of a FET 340. The source terminal of FET 340 is coupled to Vss 350 while the drain terminal is coupled to the source terminal of FET 330. The drain terminal of FET 330 is coupled to the gate terminal of FET 360. The source terminal of FET 360 is coupled to a junction node 370 from which the output 380 of the D flip flop 310 is tapped. Also coupled to the drain terminal of FET 330 is the source terminal of FET 390. The drain terminal of FET 390 is coupled to $V_{DD}$ 400. $V_{DD}$ 400 is also coupled to the drain terminal of FET 360.

The junction node 370 serves as a coupling point for the gate terminal of FET 390 and a drain terminal of a reset FET 410. The reset FET 410 has a gate terminal which receives a reset input to the D flip flop 310 and a source terminal coupled to Vss 350.

In the phase frequency detector of FIG. 2, the D flip flop 310 of FIG. 3 would receive the reference input 140 at the input terminal 300. This reference input is applied to FET 330 and a delayed and inverted version is applied to FET 340. When the rising edge of the reference input occurs, FET 330 pulls the left side of the latch (a cross coupled latch formed by FETs 390, 360) low. In order to make the latch edge sensitive, the falling edge of the inverted input reference signal, applied to FET 340, falls low afterwards and turns off the left branch of the latch.

It should be noted that, as can be seen in FIG. 3, the FETs 330, 340, 410 are n channel FETs while FETs 360, 390 are p channel FETs. While MOSFETs (metal oxide semiconductor field effect transistors) are contemplated for implementation, other types of FETs, such as JFETs, may be used.

The D type flip flop of FIG. 3 may be modified to be sensitive to both rising and falling edges of the reference input. The D type flip flop of FIG. 3 is only sensitive to and therefore only reacts to the rising edge of the input. With the addition of some FETs and some gating, the flip flop can respond to both rising and falling edges of the input. This would allow a lower input frequency to be used while achieving the performance of a higher input frequency.

Figure 4:
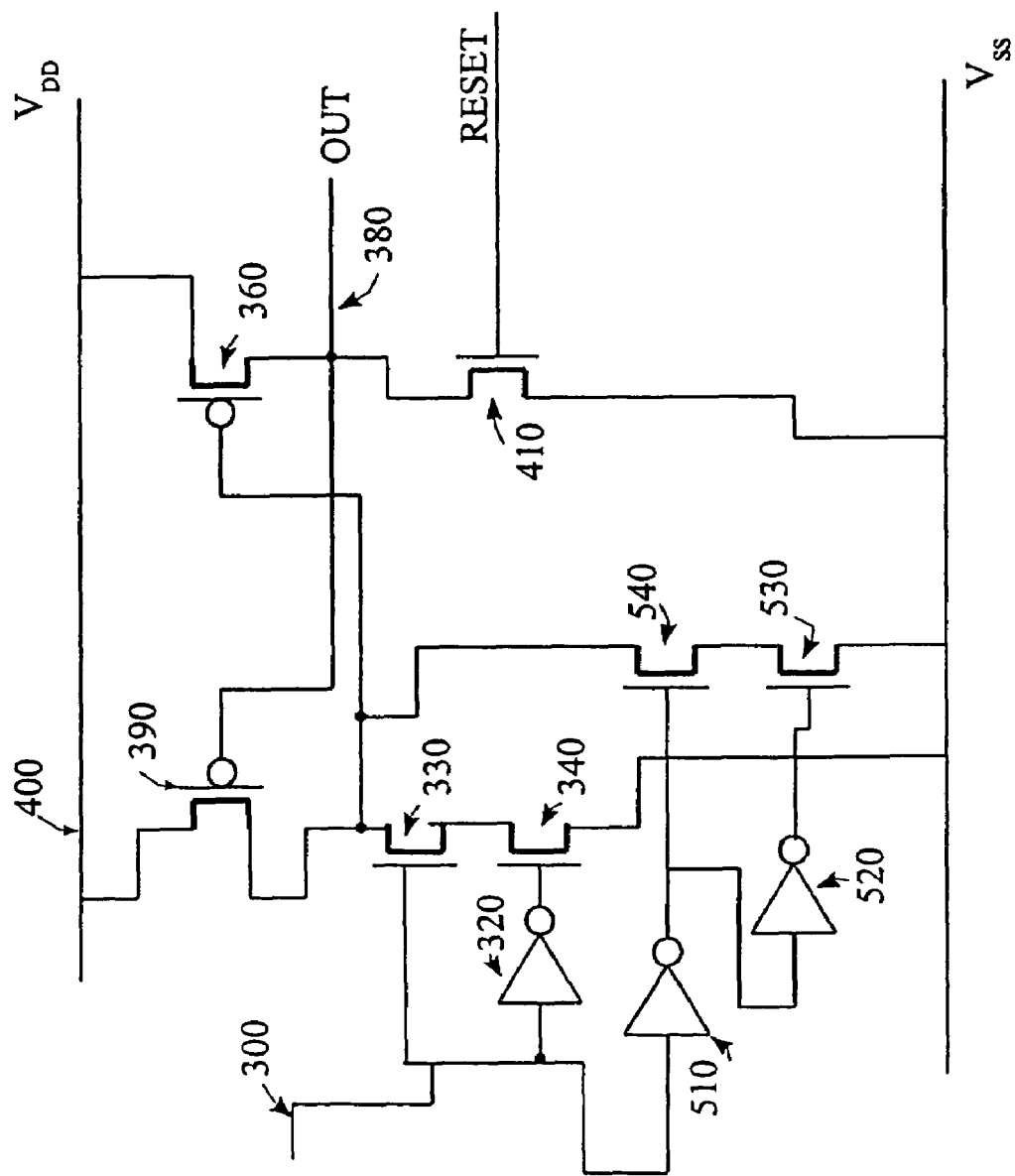
FIG. 4 illustrates a variant of the D flip-flop of FIG. 3.

Referring to FIG. 4, the D type flip flop 500 is similar to that in FIG. 3 except with the addition of branch delay elements (NOT gates) 510, 520 and FETs 530, 540. The delay element 510 receives the input 300 and the output of this NOT gate 510 is received by the gate terminal of FET 540. The output of NOT gate 510 is also received by delay element (NOT gate) 520, the output of which is received by the gate terminal of FET 530. The source terminal of FET 530 is coupled to relative ground (Vss) 350 and the drain terminal of FET 530 is coupled to the source terminal of FET 540. The drain terminal of FET 540 is coupled to the drain terminal of FET 330.

The D flip flop of FIG. 4 may also be used in the phase frequency detector of FIG. 2. Using the D flip flop of FIG. 4 will allow a doubling of the input frequency. Thus, an input reference frequency of n will have the same effect is if an input frequency of 2n was used.

A person understanding this invention may now conceive of alternative structures and embodiments or variations of the above all of which are intended to fall within the scope of the invention as defined in the claims that follow.

What is claimed is:

1. A phase-frequency detector circuit comprising: a first D flip flop receiving a reference input; a second D flip flop receiving a divider input; a first NAND gate receiving a first select input and said divider input; a first NOT gate receiving an output of said first NAND gate; a NOR gate receiving an output of said first NOT gate and an output of said first D flip flop; a second NOT gate receiving an output of said NOR gate and producing a first output of said detector circuit; a second NAND gate receiving said output of said first D flip flop gate and an output of said second D flip flop; a third NOT gate receiving an output of said fourth NAND gate, an output of said third NOT gate being received as a reset input to both said first and second D flip flops.

2. A phase frequency detector according to claim 1 wherein said first D Flip flop comprises: a first FET (field effect transistor) receiving an input signal at its gate terminal; a delay element also receiving said input signal, said delay element outputting a delayed logical inverse of said input signal; a second FET receiving an output of said delay element at its gate terminal, a drain terminal of said second FET being coupled to a source terminal of said first FET, a source terminal of said second FET being coupled to a relative ground; a reset FET coupled to said relative ground by way of its source terminal, a drain terminal of said reset FET being coupled to a junction node, a gate terminal of said reset FET being coupled to an external reset input; a third FET coupled by way of its source terminal to said junction node, a drain terminal of said third FET being coupled to a power supply, a gate terminal of said third FET being coupled a drain terminal of said first FET; a fourth FET coupled to said drain terminal of said first FET by way of a source terminal of said fourth FET, a drain terminal of said fourth FET being coupled to said power supply and a gate terminal of said fourth FET being coupled to said junction node, wherein an output of said flip flop is tapped from said junctions node; said first, second and reset FETs are of the same type of FET; and said third and fourth FETs are of the same type of FET.

3. A phase frequency detector according to claim 2 wherein said first D Flip flop comprises: a first branch delay element receiving said input signal and outputting a delayed logical inverse of said output of said first branch delay element; a fifth FET coupled to said drain terminal of said first FET by way of a drain terminal of said fifth FET, a gate terminal of said fifth FET receiving an output of said first brand delay element; a sixth FET coupled to fifth FET, a drain terminal of said sixth FET being coupled to a source terminal of said fifth FET, a source terminal of said sixth FET being coupled to said relative ground, a gate terminal of said sixth FET being coupled to an output of said second branch delay element.

4. A phase frequency detector circuit comprising: a first D flip flop receiving a reference input; a second D flip flop receiving a divider input; a first NAND gate receiving a select input and said divider input; a second NAND gate receiving an output of said first NAND gate and a logical inverse of an output of said second D flip flop; a first NOT gate receiving an output of said second NAND gate and producing an output of said detector circuit; a third NAND gate receiving an output of said first D flip flop and said output of said second D flip flop; a second NOT gate receiving an output of said third NAND gate, an output of said second NOT gate being received as a reset input to both said first and second D flip flops.

5. A phase frequency detector according to claim 4 wherein said second D flip flop comprises: a first FET (field effect transistor) receiving an input signal at its gate terminal; a delay element also receiving said input signal, said delay element outputting a delayed logical inverse of said input signal; a second FET receiving an output of said delay element at its gate terminal, a drain terminal of said second FET being coupled to a source terminal of said first FET, a source terminal of said second FET being coupled to a relative ground; a reset FET coupled to said relative ground by way of its source terminal, a drain terminal of said reset FET being coupled to a junction node, a gate terminal of said reset FET being coupled to an external reset input; a third FET coupled by way of its source terminal to said junction node, a drain terminal of said third FET being coupled to a power supply, a gate terminal of said third FET being coupled a drain terminal of said first FET; a fourth FET coupled to said drain terminal of said first FET by way of a source terminal of said fourth FET, a drain terminal of said fourth FET being-coupled to said power supply and a gate terminal of said fourth FET being coupled to said junction node, wherein an output of said flip flop is tapped from said junctions node; said first, second and reset FETs are of the same type of FET; and said third and fourth FETs are of the same type of FET.

6. A phase frequency detector according to claim 4 wherein said second D flip flop comprises: a first branch delay element receiving said input signal and outputting a delayed logical inverse of said output of said first branch delay element; a fifth FET coupled to said drain terminal of said first FET by way of a drain terminal of said fifth FET, a gate terminal of said fifth FET receiving an output of said first brand delay element; a sixth FET coupled to fifth FET, a drain terminal of said sixth FET being coupled to a source terminal of said fifth FET, a source terminal of said sixth FET being coupled to said relative ground, a gate terminal of said sixth FET being coupled to an output of said second branch delay element.

7. A phase frequency detector circuit comprising: a first D flip flop receiving a reference input; a second D flip flop receiving a divider input; a first NAND gate receiving a first select input and said divider input; a first NOT gate receiving an output of said first NAND gate; a NOR gate receiving an output of said first NOT gate and an output of said first D flip flop; a second NOR gate receiving an output of said NOR gate and producing first output of said detector circuit; a second NAND gate receiving a second select input and said divider input; a third NAND gate receiving an output of said first D flip flop and an output of said second D flip flop; a third NOT gate receiving an output of said third NAND gate, an output of said third NOT gate being received as a reset input to both said first and second D flip flops; a fourth NAND gate receiving a second select input and said divider input; a fifth NAND gate receiving an output of said first NAND gate and a logical inverse of said output of said second D flip flop; a fourth NOT gate receiving an output of said fifth NAND gate and producing a second output of said detector circuit.

8. A phase frequency detector according to claim 7 wherein at least one of said first D flip flop and said second D flip flop comprises: a first FET (field effect transistor) receiving an input signal at its gate terminal; a delay element also receiving said input signal, said delay element outputting a delayed logical inverse of said input signal; a second FET receiving an output of said delay element at its gate terminal, a drain terminal of said second FET being coupled to a source terminal of said first FET, a source terminal of said second FET being coupled to a relative ground; a reset FET coupled to said relative ground by way of its source terminal, a drain terminal of said reset FET being coupled to a junction node, a gate terminal of said reset FET being coupled to an external reset input; a third FET coupled by way of its source terminal to said junction node, a drain terminal of said third FET being coupled to a power supply, a gate terminal of said third FET being coupled a drain terminal of said first FET; a fourth FET coupled to said drain terminal of said first FET by way of a source terminal of said fourth FET, a drain terminal of said fourth FET being coupled to said power supply and a gate terminal of said fourth FET being coupled to said junction node, wherein an output of said flip flop is tapped from said junctions node; said first, second and reset FETs are of the same type of FET; and said third and fourth FETs are of the same type of FET.

9. A phase frequency detector according to claim 8 wherein at least one of said first D flip flop and said second D flip flop comprises: a first branch delay element receiving said input signal and outputting a delayed logical inverse of said output of said first branch delay element; a fifth FET coupled to said drain terminal of said first FET by way of a drain terminal of said fifth FET, a gate terminal of said fifth FET receiving an output of said first brand delay element; a sixth FET coupled to fifth FET, a drain terminal of said sixth FET being coupled to a source terminal of said fifth FET, a source terminal of said sixth FET being coupled to said relative ground, a gate terminal of said sixth FET being coupled to an output of said second branch delay element.

10. A phase frequency detector circuit according to claim 7 wherein said first and second select inputs determine which pulse outputs of said detector circuit are to be extended.

11. A phase frequency detector comprising: at least two D flip flops; a plurality of logic gates, at least one of said logic gates being coupled to at least one of said D flip flops, wherein at least one of said at least two D flip flops comprises: a first FET (field effect transistor) receiving an input signal at its gate terminal; a delay element also receiving said input signal, said delay element outputting a delayed logical inverse of said input signal; a second FET receiving an output of said delay element at its gate terminal, a drain terminal of said second FET being coupled to a source terminal of said first FET, a source terminal of said second FET being coupled to a relative ground; a reset FET coupled to said relative ground by way of its source terminal, a drain terminal of said reset FET being coupled to a junction node, a gate terminal of said reset FET being coupled to an external reset input; a third FET coupled by way of its source terminal to said junction node, a drain terminal of said third FET being coupled to a power supply, a gate terminal of said third FET being coupled a drain terminal of said first FET; a fourth FET coupled to said drain terminal of said first FET by way of a source terminal of said fourth FET, a drain terminal of said fourth FET being coupled to said power supply and a gate terminal of said fourth FET being coupled to said junction node, wherein an output of said flip flop is tapped from said junctions node; said first, second and reset FETs are of the same type of FET; and said third and fourth FETs are of the same type of FET.

12. A phase frequency detector according to claim 11 wherein said at least one of said at least two D flip flops further comprises: a first branch delay element receiving said input signal and outputting a delayed logical inverse of said output of said first branch delay element; a fifth FET coupled to said drain terminal of said first FET by way of a drain terminal of said fifth FET, a gate terminal of said fifth FET receiving an output of said first brand delay element; a sixth FET coupled to fifth FET, a drain terminal of said sixth FET being coupled to a source terminal of said fifth FET, a source terminal of said sixth FET being coupled to said relative ground, a gate terminal of said sixth FET being coupled to an output of said second branch delay element.

13. A phase frequency detector according to claim 11 wherein said detector receives at least one select input, said at least one select input determining which output pulses of said detector is extended.

14. A phase frequency detector according to claim 11 wherein at least one of said at least two D flip flops has for an input frequency of n, a output frequency of 2n.

* * * * *